United States Patent
Tsutsui

(10) Patent No.: US 11,804,849 B2
(45) Date of Patent: Oct. 31, 2023

(54) INFINITE IMPULSE RESPONSE FILTERS WITH DITHERING AND METHODS OF OPERATION THEREOF

(71) Applicant: STMicroelectronics KK, Tokyo (JP)

(72) Inventor: Ryo Tsutsui, Matsudo (JP)

(73) Assignee: STMICROELECTRONICS KK, Tokyo (JP)

( * ) Notice: Subject to any disclaimer, the term of this patent is extended or adjusted under 35 U.S.C. 154(b) by 0 days.

(21) Appl. No.: 17/657,991

(22) Filed: Apr. 5, 2022

(65) Prior Publication Data

US 2022/0231697 A1 Jul. 21, 2022

Related U.S. Application Data

(62) Division of application No. 16/683,859, filed on Nov. 14, 2019, now Pat. No. 11,323,130.

(60) Provisional application No. 62/768,631, filed on Nov. 16, 2018.

(51) Int. Cl.
| | |
|---|---|
| *H03M 3/00* | (2006.01) |
| *G06F 7/58* | (2006.01) |
| *H03M 1/06* | (2006.01) |
| *H03H 17/00* | (2006.01) |
| *H03H 17/02* | (2006.01) |

(52) U.S. Cl.
CPC .............. *H03M 3/33* (2013.01); *G06F 7/588* (2013.01); *H03M 1/0626* (2013.01); *G06F 2207/583* (2013.01); *H03H 17/0213* (2013.01); *H03H 2017/0072* (2013.01)

(58) Field of Classification Search
CPC .................. H03M 3/33; H03M 1/0626; H03H 2017/0072; H03H 2017/009; H03H 2017/0214; H03H 17/0211; H03H 17/0213; H03H 17/0216; H03H 17/0217; H03H 17/04; G06F 7/58–588; G06F 2207/58–583
See application file for complete search history.

(56) References Cited

U.S. PATENT DOCUMENTS

| | | |
|---|---|---|
| 6,236,731 B1 | 5/2001 | Brennan et al. |
| 2005/0076073 A1 | 4/2005 | Gurrapu |
| 2008/0123979 A1 | 5/2008 | Schoner |
| 2011/0267210 A1 | 11/2011 | Risbo et al. |

*Primary Examiner* — Emily E Larocque
(74) *Attorney, Agent, or Firm* — Slater Matsil, LLP

(57) ABSTRACT

An infinite impulse response filter includes a plurality of lower order filter stages and a random number generator circuit. The plurality of lower order filter stages include a first filter stage coupled to a second filter stage. The random number generator circuit includes a first output coupled to the first filter stage and a second output coupled to the second filter stage. The random number generator circuit is configured to generate the same random value at both the first output and the second output. The infinite impulse response filter is an $n^{th}$-order filter. The respective order of each of the lower order filter stages is less than n.

20 Claims, 5 Drawing Sheets

INFINITE IMPULSE RESPONSE FILTERS WITH DITHERING AND METHODS OF OPERATION THEREOF

CROSS-REFERENCE TO RELATED APPLICATIONS

This application is a divisional application of U.S. application Ser. No. 16/683,859, filed Nov. 14, 2019, which claims the benefit of U.S. Provisional Application No. 62/768,631 filed on Nov. 16, 2018, which applications are hereby incorporated herein by reference in their entirety.

TECHNICAL FIELD

The present invention relates generally to infinite impulse response filters, and, in particular embodiments, to infinite impulse response filter devices and the methods of operation thereof.

BACKGROUND

Infinite impulse response filters (IIR) filters are widely used for signal processing. Compared with finite impulse response (FIR) filters, IIR filters usually provide better frequency response at the same computational cost. However, IIR filters are more precision-sensitive. Consequently, IIR filters can suffer from inaccuracy problems or, in some cases, divergence if improperly implemented. This risk is particularly true for IIR filter implemented with fixed-point processors and with fixed-point hardware IPs.

SUMMARY

In accordance with an embodiment of the invention, a method of filtering includes generating a random value by a random number generator circuit, filtering a first signal by a first filter to form a filtered first signal, dithering the filtered first signal using the random value to form a dithered first signal, filtering a second signal by a second filter to form a filtered second signal, and dithering the filtered second signal using the random value to form a dithered second signal.

In accordance with another embodiment of the invention, an IIR filter includes a plurality of lower order filter stages and a random number generator circuit. The plurality of lower order filter stages includes a first filter stage coupled to a second filter stage. The random number generator circuit includes a first output coupled to the first filter stage and a second output coupled to the second filter stage. The random number generator circuit is configured to generate a random value at both the first output and the second output. The IIR filter is an $n^{th}$ order filter and a respective order of each of the lower order filter stages is less than n.

In accordance with still another embodiment of the invention, a multichannel IIR filter includes a plurality of channels and a random number generator circuit. The plurality of channels includes a first channel and a second channel. The random number generator circuit includes a first output coupled to a first filter of the first channel and a second output coupled to a second filter of the second channel. The random number generator circuit is configured to generate a random value at both the first output and the second output.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
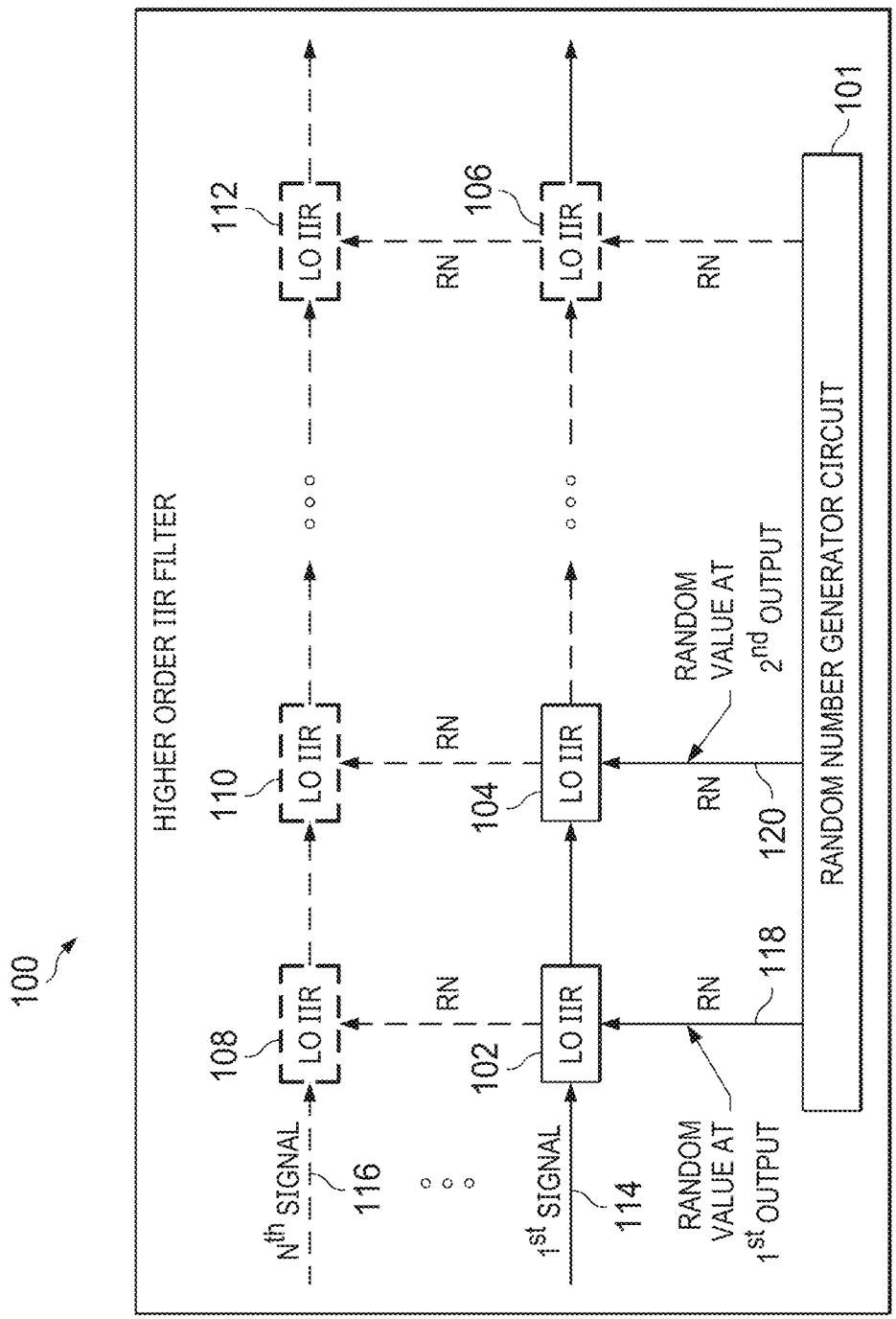
FIG. 1 illustrates an example higher order IIR filter including a plurality of lower order IIR filters and a single random number generator circuit in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques may be utilized to improve the accuracy and stability of higher order IIR filters. One possible technique is to simply enlarge the bitwidth of registers to guarantee the desired accuracy. For example, single-precision registers may be enlarged to become double-precision registers so that accuracy may be improved. Other possible techniques may be to utilize topologies such as all-pass nodes and/or biquadratic decomposition that are less accuracy-sensitive. Application-specific optimization may also be applied to filter topologies.

One specific technique to improve the accuracy and stability of higher order IIR filter is to apply dither to the output of the higher order IIR filter before quantizing it. Applying dither (also referred to as dithering) is the intentional application of random noise to a signal. Dithering may be used to randomize quantization error such that the correlation between the signal and the quantization error may be reduced and/or eliminated. Dither may be used in a variety of contexts such as digital audio, digital video, digital photography, seismology, radar and weather forecasting systems. For example, dithering may be utilized in delta-sigma modulators (noise shapers).

Dither may have a variety of advantages when applied to a higher order IIR filter. For example, dithering may advantageously reduce and/or eliminate the risk of self-oscillation that happens even if the input signal is mute (zeros). However, dithering may also introduce additional computational steps due to the generation of random values. Therefore, it may be desirable to implement dithering in a higher order IIR filter while minimizing the computational cost in order to improve accuracy and/or stability of the higher order IIR filter while reducing computational load.

Embodiments provided below describe various IIR filters with dithering and various methods of operating IIR filters with dithering, in particular, IIR filters having a plurality of lower order IIR filters and a single random number generator circuit. The IIR filters may have various advantages over conventional IIR filters. The following description describes the embodiments. Several embodiment IIR filters with a plurality of lower order IIR filters and a single random number generator circuit are described using FIGS. 1-3. An embodiment system including a higher order IIR filter is described using FIG. 4. A graph of impulse response versus time for various IIR filters is described using FIG. 5.

An N-order IIR filter can be represented by the following equation:

$$H(z) = \frac{A(z)}{B(z)} = \frac{\sum_n^N a_n z^{-n}}{\sum_n^N b_n z^{-n}} \quad (1.0)$$

In Eq. 1.0, the transfer function as a function of complex frequency H(z) is the ratio of the output A(z) to the input B(z). Here, the coefficients $a_n$ are the feedforward coefficients, $b_n$ are the feedback coefficients, and $b_o=1$ in the normalized formula. It may be beneficial to maintain stability criteria so that the IIR filter works stably. For example, the stability criteria may be that all poles are inside of the unit circle in the z-plane. In other words, for this criterion to be maintained, the denominator polynomial B(z) will have roots whose absolute values are all less than 1. However, even if an IIR filter satisfies this rule, there may still be a chance of an inaccuracy issue or even divergence, if it is improperly implemented. This may be true, for example, when the IIR filter has poles that are close to the unit circle and/or when the system matrix is considered to be ill-conditioned.

In various embodiments, the lower order IIR filters may be implemented as biquadratic (biquad) filters. Higher order IIR filters may be decomposed biquad IIR filters in various configurations such as a cascade configuration, or a parallel configuration. For a cascade configuration, multiple biquad filters are connected in series. The transfer function of a higher order IIR filter implemented using n biquad filters in a cascade configuration can be written as $$H(z) = \prod H_n(z) = \prod \frac{a_{n,0} + a_{n,1}z^{-1} + a_{n,2}z^{-2}}{1 + b_{n,1}z^{-1} + b_{n,2}z^{-2}} \quad (1.1)$$

Similarly, in a parallel configuration, multiple biquad filters are connected in parallel. The transfer function of a higher order IIR filter implemented using n biquad filters in a parallel configuration can be written as $$H(z) = \sum S_n(z) = \sum \frac{c_{n,0} + c_{n,1}z^{-1} + c_{n,2}z^{-2}}{1 + d_{n,1}z^{-1} + d_{n,2}z^{-2}} \quad (1.2)$$

It may be noted that in a specific case where N is odd for an $N^{th}$ order IIR filter implemented using lower order IIR filters such as biquad filters, the above decomposition shall contain a first-order IIR filter. However, the above equations may still be viewed as general to this situation as a first-order IIR filter is a sub-class of biquad filters where $a_2=b_2=0$ in Eq. (1.1) or $c_2=d_2=0$ in Eq. (1.2). Therefore, in any of the following embodiments, a biquad filter may also refer to a first-order filter.

Decomposing a higher order IIR filter into a plurality of biquad IIR filters may have a beneficial effect of reducing the sensitivity to precision of the higher order IIR filter. In order to further reduce the sensitivity to precision, dithering may be used at an output of each biquad filter. In particular, dithering may be implemented before quantization of a filtered signal.

In a specific case of a direct-I implementation of a biquad filter, the biquad filter output can be calculated as follows:

$$\text{sum}=a_0 x(n)+a_1 x(n-1)+a_2 x(n-2)-b_1 y(n-1)-b_2 y(n-2) \quad (1.3)$$

When all data values (x, y, a, b) are N bit integers, the summation result sum may have 2N-1 bits or more in its value. In a specific implementation, accumulators that have 2N bits or more may be used which are capable of holding such values. Before writing this temporal value back to memory (or register), the precision of the sum value may need to be reduced such that it only has N bits (e.g., is in the N bit range).

This can be achieved in several ways which can be written as Eqs. (2)-(4) below.

$$y(n)=\text{saturate}[\text{sum}>>M], \quad (2)$$

$$y(n)=\text{saturate}[(\text{sum}+\text{round})>>M], \text{ or} \quad (3)$$

$$y(n)=\text{saturate}[(\text{sum}+\text{rand}(n))>>M], \quad (4)$$

In Eqs. (2)-(4), M is a scale factor (or so-called Q-format) of the coefficient (a, b), >> is the arithmetic right-shift operation, saturate is a saturation into N bit, round is typically $2^{M-1}$, and rand(n) is a random number generator output. For example, the random generator output may range from 0 to $2^M$ as a specific example. The sum may be right-shifted by M bits so that y(n) has the same scale factor as y(n-1) and y(n-2). In Eqs. (2)-(4), Eq. (2) represents a truncation to negative-infinite, Eq. (3) represents rounding to a nearest integer, and Eq. (4) represents dithering. Of the three example methods of reducing the precision of the sum value, only the dithering method uses additional computational steps due to the inclusion of random number generation.

Figure 2:
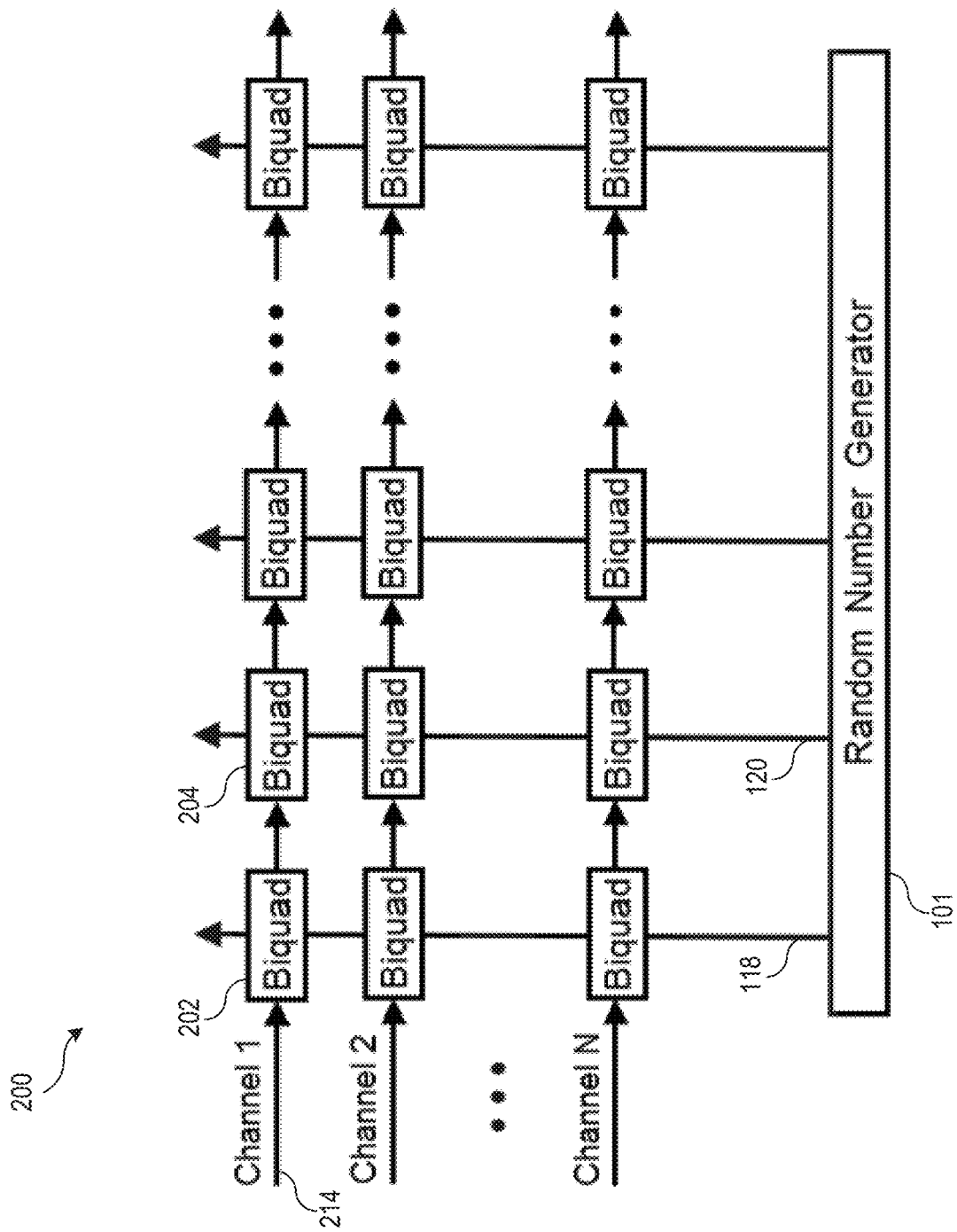
FIG. 2 illustrates an example higher order IIR filter including a plurality of biquadratic filters in a cascade configuration and a single random number generator circuit in accordance with an embodiment of the invention.
Figure 3:
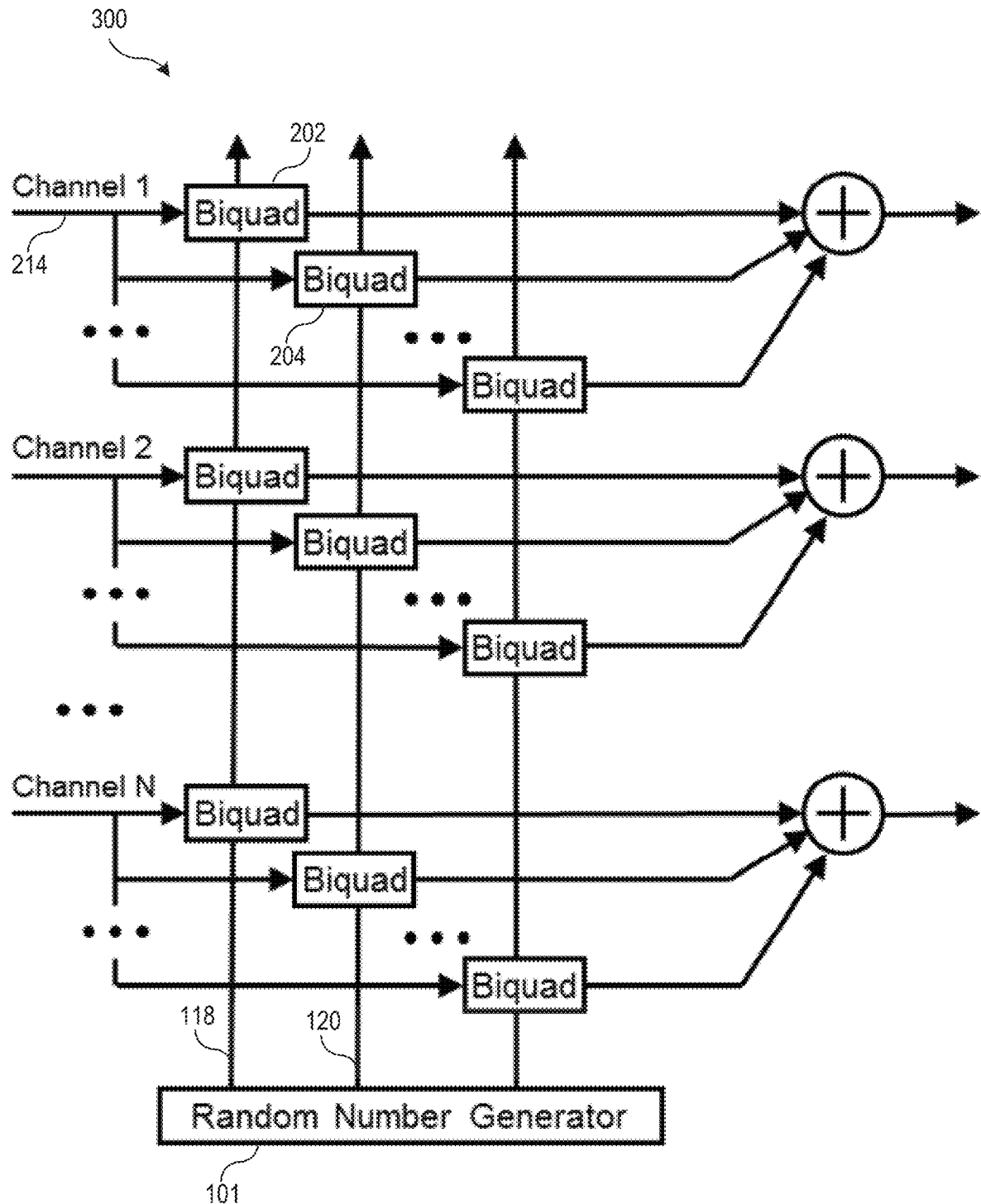
FIG. 3 illustrates an example higher order IIR filter including a plurality of biquadratic filters in a parallel configuration and a single random number generator circuit in accordance with an embodiment of the invention.

Since the use of dithering uses additional computational steps, it may be advantageous to use only one dithering circuit so that the benefits of dithering may be realized while minimizing the computational load on the higher order IIR filter. Therefore, in various embodiments, in order to minimize the additional computational cost due to random number generation, only one random number generator circuit is included in the higher order IIR filter. An output random number value of the random number generator circuit is fed to the lower orders. This is illustrated in FIGS. 1-3 in the following.

One possible advantage of this configuration is that the additional computational cost of dithering can be reduced to just 1) loading the random number value RN and 2) adding the random number value RN to the accumulator before truncating. The random number generation circuit itself includes its own computation, but the computational load of a single random number generation circuit may be relatively small in comparison with the computational load of multiple lower order IIR filter stages and/or multiple channels.

FIG. 1 illustrates an example higher order IIR filter including a plurality of lower order IIR filters and a single random number generator circuit in accordance with an embodiment of the invention.

Referring to FIG. 1, a higher order IIR filter wo includes a random number generator circuit 101 including a first output 118 and a second output 120. The random number generator circuit 101 may optionally include additional outputs as shown. The random number generator circuit is configured to generate a single random number value RN at each output.

The higher order IIR filter 100 also includes a plurality of lower order IIR filters. For example, the higher order IIR filter 100 includes a first lower order IIR filter 102 and a second lower order IIR filter 104. An output of the first lower order IIR filter 102 may be coupled to an input of the second lower order IIR filter 104 in a cascade configuration. For example, the first lower order IIR filter 102 receives a first signal 114 at an input and filters the first signal to generate a first filtered signal. The second lower order IIR filter 104 receives and filters the first filtered signal to generate a second filtered signal. The higher order IIR filter 100 may also optionally include additional lower order IIR filters 106 coupled to the second lower order IIR filter 104.

The string of lower order IIR filters including the first lower order IIR filter 102 and the second lower order IIR filter 104 may be a channel and the higher order IIR filter 100 may be a multichannel higher order IIR filter. For example one or more additional signals 116 may be received by one or more channels each including optional additional lower order IIR filters 108, 110, and 112.

The random number value RN is provided at each of the lower order IIR filters 102, 104, 106, 108, 110, 112 that are included in the higher order IIR filter 100. The higher order IIR filter 100 may advantageously use the random number value RN to apply dither to each lower order IIR filter stage while minimizing computational load. For example, the higher order IIR filter 100 may have the same computational load regardless of the number of channels or the number of lower order IIR filters per channel.

FIG. 2 illustrates an example higher order IIR filter including a plurality of biquadratic filters in a cascade configuration and a single random number generator circuit in accordance with an embodiment of the invention. The higher order IIR filter of FIG. 2 may be a specific implementation of other embodiment higher order IIR filters as described herein, such as the higher order IIR filter 100 of FIG. 1, for example. Similarly labeled elements may be as previously described.

Referring to FIG. 2, a higher order IIR filter 200 includes a random number generator circuit 101 including a plurality of outputs. A random number value RN is generated at each output of the random number generator and provided to each biquad filter included in the higher order IIR filter 200. For example, higher order IIR filter 200 includes a first biquad filter 202 and a second biquad filter 204. The first biquad filter 202 and the second biquad filter 204 are specific implementations of lower order IIR filters. As shown, higher order IIR filter 200 includes N channels which each include a plurality of biquad filters in a cascade configuration. The first biquad filter 202 receives a first channel signal 214 at an input. The random number value RN generated by the random number generator circuit 101 is provided to each of the biquad filters in each of the channels of the higher order IIR filter 200.

FIG. 3 illustrates an example higher order IIR filter including a plurality of biquadratic filters in a parallel configuration and a single random number generator circuit in accordance with an embodiment of the invention. The higher order IIR filter of FIG. 3 may be a specific implementation of other embodiment higher order IIR filters as described herein, such as the higher order IIR filter 100 of FIG. 1, for example. Similarly labeled elements may be as previously described.

Referring to FIG. 3, a higher order IIR filter 300 includes a random number generator circuit 101, a first biquad filter 202 that receives a first channel signal 214, and a second biquad filter 204 that also receives the first channel signal 214. As with previous embodiments, the random number value RN generated by the random number generator circuit 101 is provided to all biquad filters of the higher order IIR filter 300. In contrast to the higher order IIR filter 200 of FIG. 2, each channel of the higher order IIR filter 300 includes a plurality of biquad filters in a parallel configuration.

The higher order IIR filter implementations described herein may be particularly useful when fixed point processing is used in the higher order IIR filter system. Advantageously, for fixed point systems, dithering may be relatively simple to implement. When the number of random number generator circuits is limited to one per higher order IIR filter, additional advantages may be achieved such as increased simplicity and decreased computational requirements of the system. This may be especially true for systems that apply IIR filtering to multichannel signal paths and/or multiple lower order filtering (e.g., biquad filtering) stages to form a higher order IIR filters.

For the specific case in which a higher order IIR filter includes multiple cascaded biquad stages, each may represent a parametric equalizer of an audio signal. The random number value RN of the random number generator circuit may be added to each biquad stage output before being truncated to the system-specific bit-width for fixed point systems.

The means of random number generation can be realized by any suitable type: linear feedback shift registers, linear congruential for uniform probability distribution function (PDF), or a mix of such to form triangle PDF, etc. Each biquad section may be implemented with different precision, i.e., having different bit-widths in the coefficients and or data, so that the computation and accuracy can be best balanced for a given practical implementation.

Figure 4:
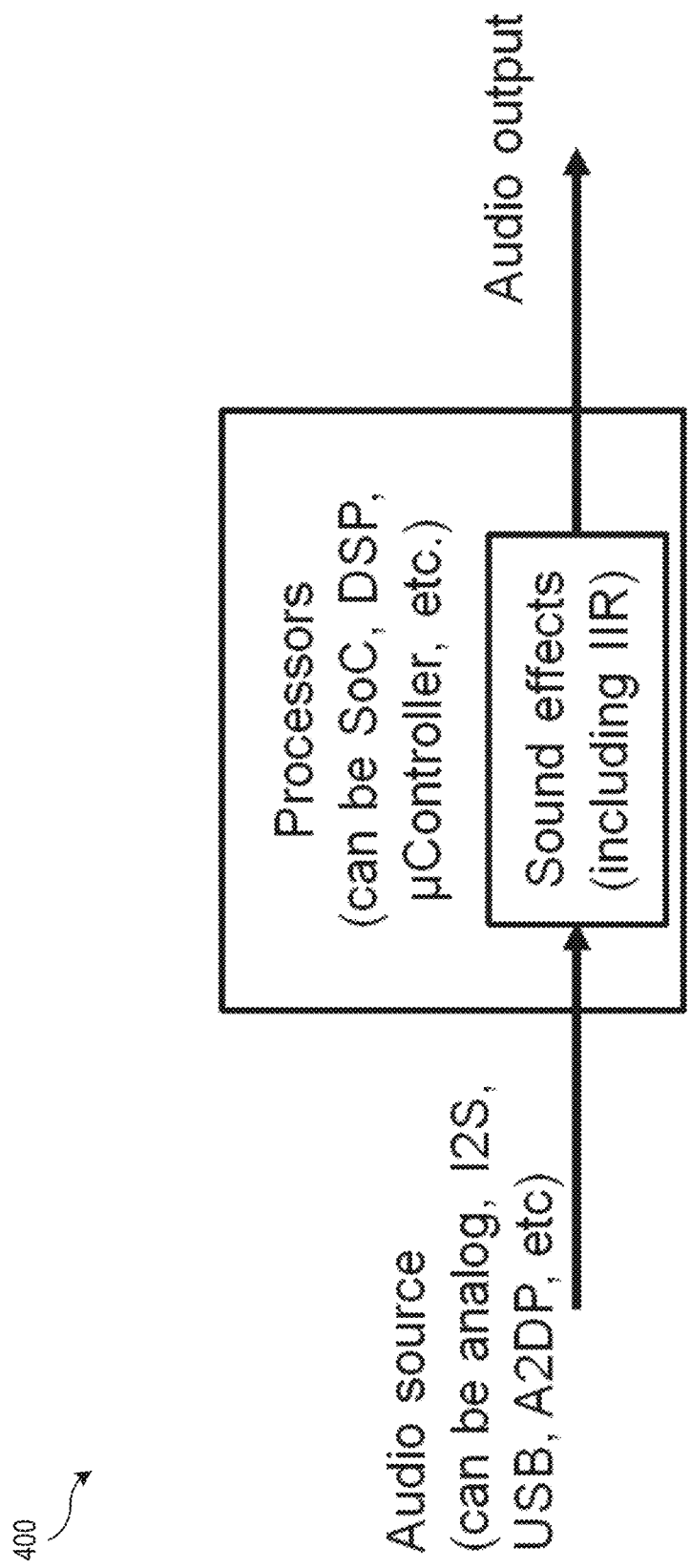
FIG. 4 illustrates an example system including a higher order IIR filter in accordance with an embodiment of the invention.

FIG. 4 illustrates an example system including a higher order IIR filter in accordance with an embodiment of the invention.

Referring to FIG. 4, a system 400 includes a signal source at an input of a signal processing block. The input of the signal processing block may have multiple channels and receive multiple signals. After processing the received signal(s), a filtered output is generated at an output of the filter block. The signal source may be digital or analog. For example, the signal source may be an audio source or a video source. The signal may have any suitable format such as I2S, USB, A2DP, and the like.

The signal processing block may include various processors for processing the received signal(s). For example, a processor included in the signal processing block may be implemented as a system on a chip (SoC), digital signal processor (DSP), microcontroller, and others. A filter block may also be included which includes a higher order IIR filter implemented using a plurality of lower order IIR filters and a single random number generator circuit. For example, in an audio system, the filter block may modify received audio signals to produce sound effects. The system 400 may advantageously provide stable and accurate signal filtering with minimal additional computation cost compared to conventional systems.

Figure 5:
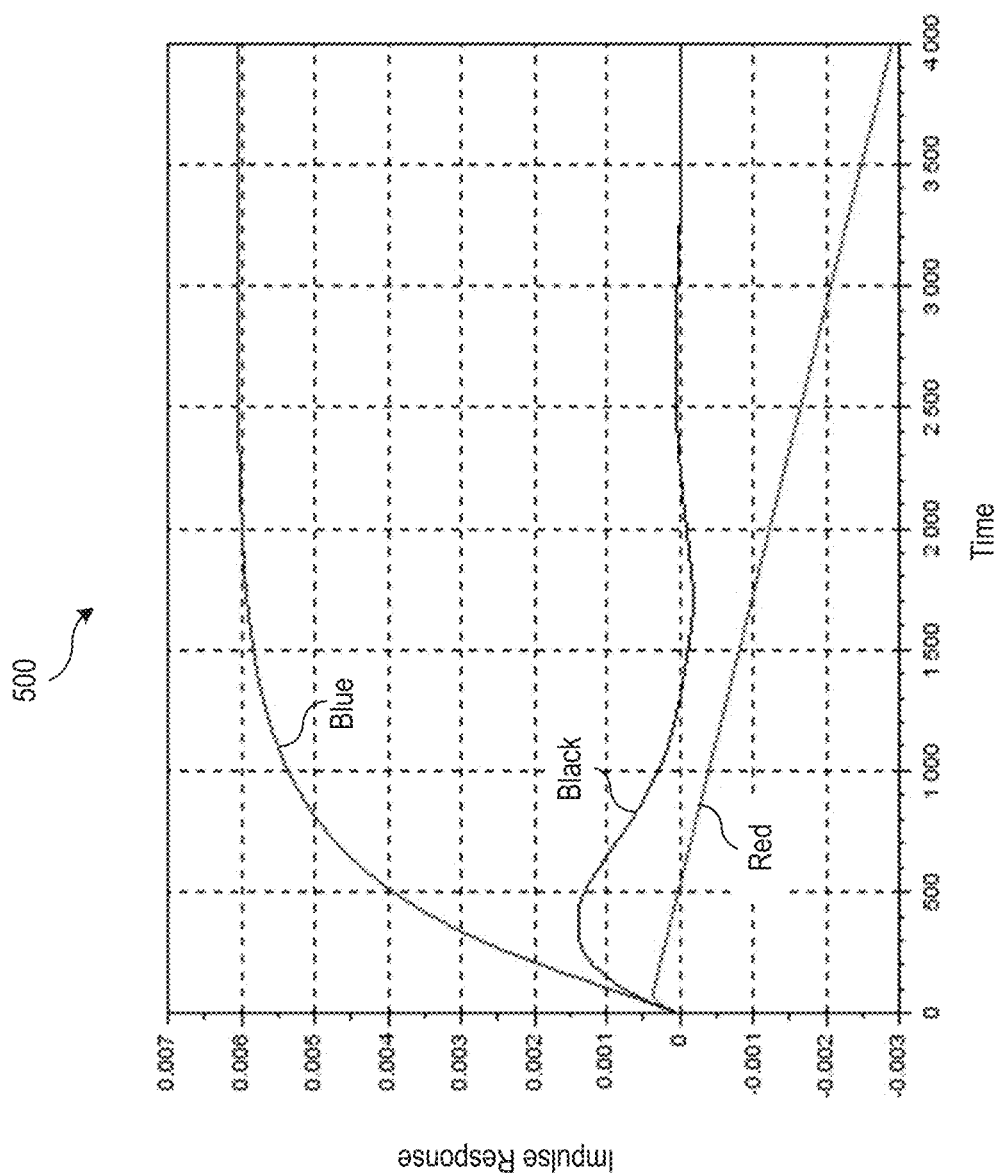
FIG. 5 illustrates a graph of impulse response versus time for various IIR filters including an IIR filter with dithering.

FIG. 5 illustrates a graph of impulse response versus time for various IIR filters including an IIR filter with dithering. As shown, the impulse response is plotted as a function of time for three IIR filters. Specifically, the IIR filters are Butterworth low-pass filters (LPF), each implementing a different method of reducing precision of the sum value. However, only the IIR filter that uses dithering returns to 0 after a signal pulse is input.

Example embodiments of the invention are summarized here. Other embodiments can also be understood from the entirety of the specification as well as the claims filed herein.

Example 1. A method of filtering including: generating a random value by a random number generator circuit; filtering a first signal by a first filter to form a filtered first signal; dithering the filtered first signal using the random value to form a dithered first signal; filtering a second signal by a second filter to form a filtered second signal; and dithering the filtered second signal using the random value to form a dithered second signal.

Example 2. The method according to example 1, where the second signal is the dithered first signal.

Example 3. The method according to one of examples 1 and 2, where generating the random value includes: simultaneously generating the random value by the random number generator circuit at a first output of the random number generator circuit and a second output of the random number generator circuit, the first output being coupled to the first filter and the second output being coupled to the second filter.

Example 4. The method according to one of examples 1 to 3, where the first signal and the second signal are digital signals.

Example 5. The method according to one of examples 1 to 3, where the first signal and second signal are analog signals.

Example 6. The method according to one of examples 1 to 5, where the first signal and the second signal are audio signals.

Example 7. The method according to one of examples 1 to 5, where the first signal and the second signal are video signals.

Example 8. An infinite impulse response (IIR) filter including: a plurality of lower order filter stages including a first filter stage coupled to a second filter stage; and a random number generator circuit including a first output coupled to the first filter stage and a second output coupled to the second filter stage, the random number generator circuit configured to generate a random value at both the first output and the second output, where the IIR filter is an $n^{th}$ order filter, and where a respective order of each of the lower order filter stages is less than n.

Example 9. The IIR filter according to example 8, where each of the plurality of lower order filter stages includes a biquadratic filter.

Example 10. The IIR filter according to one of examples 8 and 9, where the plurality of lower order filter stages includes a plurality of filters connected in a cascade configuration.

Example 11. The IIR filter according to one of examples 8 to 10, where the plurality of lower order filter stages includes a plurality of filters connected in a parallel configuration.

Example 12. The IIR filter according to one of examples 8 to 11, where the IIR filter is a fixed point IIR filter.

Example 13. The IIR filter according to one of examples 8 to 12, where the plurality of lower order filter stages includes a plurality of parametric equalizers.

Example 14. A multichannel infinite impulse response (IIR) filter including: a plurality of channels including a first channel and a second channel; and a random number generator circuit including a first output coupled to a first filter of the first channel and a second output coupled to a second filter of the second channel, the random number generator circuit configured to generate a random value at both the first output and the second output.

Example 15. The multichannel IIR filter according to example 14, where each of the plurality of channels includes a plurality of lower order filter stages that altogether reconstruct the multichannel IIR filter.

Example 16. The multichannel IIR filter according to one of examples 14 and 15, where each of the plurality of channels includes a string of biquadratic filters.

Example 17. The multichannel IIR filter according to one of examples 14 to 16, where each of the plurality of channels includes a plurality of filters connected in a cascade configuration.

Example 18. The multichannel IIR filter according to one of examples 14 to 16, where each of the plurality of channels includes a plurality of filters connected in a parallel configuration.

Example 19. The multichannel IIR filter according to one of examples 14 to 18, where the multichannel IIR filter is a fixed point multichannel IIR filter.

Example 20. The multichannel IIR filter according to one of examples 14 to 19, where each of the plurality of channels is a parametric equalizer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An infinite impulse response (IIR) filter comprising:
   a plurality of lower order filter stages comprising a first filter stage coupled to a second filter stage; and
   a random number generator circuit comprising a first output coupled to the first filter stage and a second output coupled to the second filter stage, the random number generator circuit configured to generate a same random value at both the first output and the second output, wherein the IIR filter is an nth-order filter, and wherein a respective order of each of the plurality of lower order filter stages is less than n.

2. The IIR filter according to claim 1, wherein each of the plurality of lower order filter stages comprises a biquadratic filter.

3. The IIR filter according to claim 1, wherein the plurality of lower order filter stages comprises a plurality of filters connected in a cascade configuration.

4. The IIR filter according to claim 1, wherein the plurality of lower order filter stages comprises a plurality of filters connected in a parallel configuration.

5. The IIR filter according to claim 1, wherein the IIR filter is a fixed point IIR filter.

6. The IIR filter according to claim 1, wherein the plurality of lower order filter stages comprises a parametric equalizer.

7. An infinite impulse response (IIR) filter comprising:
a string of biquadratic filters comprising a first biquadratic filter coupled to a second biquadratic filter; and
a random number generator circuit coupled to the string of biquadratic filters, the random number generator circuit being configured to generate a same random value at both the first biquadratic filter and the second biquadratic filter.

8. The IIR filter according to claim 7, wherein the IIR filter is an nth-order filter, n being greater than 2.

9. The IIR filter according to claim 7, wherein the first biquadratic filter is a first-order filter, and wherein the IIR filter is an nth-order filter, n being odd.

10. The IIR filter according to claim 7, wherein the string of biquadratic filters is connected in a cascade configuration.

11. The IIR filter according to claim 7, wherein the string of biquadratic filters is connected in a parallel configuration.

12. The IIR filter according to claim 7, wherein the IIR filter is a fixed point IIR filter.

13. The IIR filter according to claim 7, wherein the IIR filter is a multichannel IIR filter comprising:
a first channel comprising the string of biquadratic filters; and
a second channel comprising an additional string of biquadratic filters that comprise a third biquadratic filter coupled to a fourth biquadratic filter, the random number generator circuit being further configured to generate the same random value at both the third biquadratic filter and the fourth biquadratic filter.

14. A method of filtering comprising:
generating a same random value at both a first lower order filter stage and a second lower order filter stage using a random number generator circuit;
dithering a first signal filtered by the first lower order filter stage using the same random value to form a dithered first signal; and
dithering a second signal filtered by the second lower order filter stage using the same random value.

15. The method according to claim 14, wherein the second signal is the dithered first signal.

16. The method according to claim 14, wherein the first signal and the second signal are analog signals.

17. The method according to claim 14, wherein the first signal and the second signal are digital signals.

18. The method according to claim 14, wherein the first lower order filter stage is connected to the second lower order filter stage as part of a plurality of lower order filter stages.

19. The method according to claim 14, wherein the first lower order filter stage is part of a first channel of a multichannel infinite impulse response (IIR) filter, and wherein the second lower order filter stage is part of a second channel of the multichannel IIR filter.

20. The method according to claim 19, wherein the first channel comprises additional first lower order filter stages connected to the first lower order filter stage, wherein the second channel comprises additional second lower order filter stages connected to the second lower order filter stage, and wherein generating the same random value comprises generating the same random value at all of the additional first lower order filter stages and the additional second lower order filter stages.

* * * * *